(12) United States Patent
Boden, Jr. et al.

(10) Patent No.: US 7,569,901 B1
(45) Date of Patent: Aug. 4, 2009

(54) P CHANNEL RADHARD DEVICE WITH BORON DIFFUSED P-TYPE POLYSILICON GATE

(75) Inventors: Milton J. Boden, Jr., Redondo Beach, CA (US); Yuan Xu, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 46 days.

(21) Appl. No.: 09/691,083

(22) Filed: Oct. 18, 2000

Related U.S. Application Data (62) Division of application No. 09/020,837, filed on Feb. 9, 1998, now Pat. No. 6,165,821.

(51) Int. Cl.
*H01L 21/336* (2006.01)
(52) U.S. Cl. .............................. 257/402; 257/E21.625
(58) Field of Classification Search ................ 257/335, 257/328, 329, 346, 402, 139, 268, 273, 306, 257/E21.625; 438/268, 273, 306
See application file for complete search history.

(56) References Cited

U.S. PATENT DOCUMENTS

| | | | | |
|---|---|---|---|---|
| 4,376,672 A | * | 3/1983 | Wang et al. ................ | 438/713 |
| 4,593,302 A | | 6/1986 | Lidow et al. | |
| 5,248,627 A | * | 9/1993 | Williams .................... | 438/268 |
| 5,288,653 A | * | 2/1994 | Enjoh ......................... | 438/273 |
| 5,338,693 A | | 8/1994 | Kinzer et al. | |
| 5,418,174 A | * | 5/1995 | Kalnitsky ................... | 438/384 |
| 5,451,533 A | * | 9/1995 | Williams et al. ............ | 438/291 |
| 5,465,000 A | * | 11/1995 | Williams .................... | 257/335 |
| 5,475,252 A | | 12/1995 | Merrill et al. | |
| 5,479,037 A | * | 12/1995 | Hshieh et al. ............... | 257/328 |
| 5,529,940 A | * | 6/1996 | Yamamoto et al. ......... | 438/268 |
| 5,729,037 A | * | 3/1998 | Hshieh et al. ............... | 257/329 |
| 5,731,611 A | * | 3/1998 | Hshieh et al. ............... | 257/341 |
| 5,831,318 A | * | 11/1998 | Spring et al. ................ | 257/402 |
| 6,049,104 A | * | 4/2000 | Hshieh et al. ............... | 257/328 |
| 6,165,821 A | * | 12/2000 | Boden et al. ................ | 438/137 |
| 6,380,004 B2 | * | 4/2002 | Boden et al. ................ | 438/138 |
| 6,476,456 B1 | * | 11/2002 | Boden, Jr. ................... | 257/486 |

(Continued)

OTHER PUBLICATIONS

Wolf et al., "Silicon Processing for the VLSI Era, Process Integration" vol. 2, pp. 194-196, 1990.*
Wolf, S., "Silicon Processing For the VLSI Era: vol. 2, Process Integration", Lattice Press, pp. 207-210, 1986.*

(Continued)

*Primary Examiner*—George Fourson
(74) *Attorney, Agent, or Firm*—Farjami & Farjami LLP (57) ABSTRACT

A MOS gated device is resistant to both high radiation and SEE environments. Spaced, N-type body regions are formed in the surface of a P-type substrate of a semiconductor wafer. P-type dopants are introduced into the surface within each of the channel regions to form respective source regions therein. The periphery of each of the source regions is spaced from the periphery of its respective channel region at the surface to define N-type channel regions between the spaced peripheries. A layer of gate oxide is formed over the channel areas. A doped polysilicon gate electrode is formed atop the gate oxide. A source electrode is formed atop the source regions. The MOS gated device is optimized to maintain a threshold voltage of between −2V to −5V for a total irradiation dose of 300 Krad while maintaining SEE withstand capability.

10 Claims, 9 Drawing Sheets

U.S. PATENT DOCUMENTS

| | | | | |
|---|---|---|---|---|
| 6,707,103 B1 * | 3/2004 | Boden et al. | ............... | 257/341 |
| 6,747,312 B2 * | 6/2004 | Boden, Jr. | ............... | 257/327 |
| 6,894,345 B2 * | 5/2005 | Boden, Jr. | ............... | 257/327 |
| 2003/0040159 A1 * | 2/2003 | Sasaki | ............... | 438/286 |
| 2003/0232475 A1 * | 12/2003 | Sasaki | ............... | 438/303 |
| 2005/0106791 A1 * | 5/2005 | You et al. | ............... | 438/197 |
| 2005/0106825 A1 * | 5/2005 | You et al. | ............... | 438/301 |

OTHER PUBLICATIONS

Wolf, S. et al, "Silicon Processing for the VLSI Era: vol. 1, Process Technology", Lattice Press, 1986, pp. 207-210.*

Simulating Single-Event Burnout of n-Channel Power MOSFET's, Gregory H. Johnson, Member, IEEE, Jakob H. Hohl, Senior Member, IEEE, Ronald D. Schrimpf, Member, IEEE, and Kenneth F. Galloway, Fellow, IEEE—IEEE Transaction on Electron Devices, vol. 40, No. 5, May 1993.

* cited by examiner

P CHANNEL RADHARD DEVICE WITH BORON DIFFUSED P-TYPE POLYSILICON GATE

This is a division of application Ser. No. 09/020,837, filed Feb. 9, 1998 now U.S. Pat. No. 6,165,821.

RELATED APPLICATIONS

This application is related to U.S. Pat. No. 5,475,252, issued Dec. 12, 1995, (IR-914[Cont]) in the name of Perry Merrill and Kyle A. Spring, entitled PROCESS FOR MANUFACTURE OF RADIATION RESISTANT POWER MOSFET AND RADIATION RESISTANT POWER MOSFET and assigned to the assignee of the present invention.

FIELD OF THE INVENTION

This invention relates to radiation hardened ("radhard") MOS gated devices which have improved resistance to damage by large (megarad) doses of ionizing radiation, or by single or plural event high energy charged particles ("SEE" particles).

BACKGROUND OF THE INVENTION

Electronic devices that are used in high radiation environments, such as in outer space, are subject to many forms of radiation. The effects of ionizing radiation can accumulate over time, resulting in device degradation. Also, heavy ion strikes can lead to catastrophic failure. When power devices are employed in such environments, the devices are typically more susceptible to these problems because of their large depletion volumes and large device areas.

Radiation hardened power MOSFETs, and other MOS gated devices designed for use in space or other high radiation ambients, have the conflicting design requirements of resisting damage caused by high doses of ionizing radiation on the one hand and of resisting damage caused by even single event high energy charged particles ("SEE") on the other. Thus, a thin gate oxide is desired to resist high radiation (megarad) environments, while a relatively thick gate oxide is desired to resist SEE effects.

More specifically, it is known that after exposure to a large total dose of ionizing radiation a positive charge will build up in the gate oxide to change the device threshold voltage. Further, there is an increase of interface traps at the silicon/gate oxide boundary. Both of these effects are reduced by using a thinner gate oxide, for example, one having a thickness of less than about 900 Å.

Devices used in a high radiation environment, such as in outer space, are also subject to damage or failure if struck by even a single high energy charged particle. Such charged particles pass into or through the silicon and generate a large number of electron-hole pairs in the depletion region of the device. Some of these charges collect on the gate oxide, resulting in a high potential across the gate oxide. Thus, a thicker gate oxide, for example, one thicker than about 1300 Å is desired to resist SEE failure.

Because of these diverse requirements, different manufacturing processes are used for a "megarad" product designed for use in a high total radiation dose environment and an SEE product which is optimized for single particle effects.

In the known vertical conduction, multi-cellular MOSFET products, the charge collection at the oxide interface is in the drift region between cells.

The device voltage is set in the charge in the inversion region. Thus, a design trade-off is necessary to set the gate oxide thickness for either a thin gate oxide for good total dose resistance or relatively thicker gate oxide for good SEE resistance.

It is also known that the P channel power MOSFET devices have demonstrated less susceptibility to SEE effects compared to N channel devices. G. H. Johnson, J. H. Hohl, R. D. Schrimpf and K. F. Galloway, "Simulating Single-Event Burnout in Vertical Power MOSFETs," IEEE Trans. Electron Devices, vol. 40 pp. 1001-1008, 1993. However, the threshold of P channel devices changes more rapidly with increasing total dose since both the accumulated oxide charge and interface traps cause the threshold to become more negative.

Furthermore, as noted above, optimizing the P-channel device to provide both SEE resistance and total radiation dose resistance requires significant trade offs. Typically, the threshold voltage shift is a monotonic function of the total radiation dose because the oxide charges and the interface traps make the threshold voltage more negative. As a result, the starting threshold voltage may need to be controlled to as near to –2V as possible. Further, the gate oxide should be kept as thin as possible to minimize positive charge buildup in the oxide. However, these requirements make the device more susceptible to single event gate rupture (SEGR) because of the thinner oxide. Also, the threshold voltage is typically a function of both the channel dopant density and the gate oxide thickness. When the channel doping level is too low, gain of the parasitic bipolar transistor increases, thereby increasing the risk of single event burnout. Therefore, total radiation dose protection capability favors incorporating thinner gate oxides and lower channel doping whereas the desire for SEE protection requires thicker gate oxides and higher channel doping.

It is thus further desirable to have a radiation hardened, P channel device that is optimized to maintain a predetermined threshold voltage at a high total irradiation dose while maintaining single event withstand capability.

BRIEF DESCRIPTION OF THE INVENTION

In accordance with the present invention a P channel MOS gated device (a power MOSFET, IGBT, GTO or other device employing an MOS gate) is optimized to have both total radiation dose resistance and SEE resistance.

According to an aspect of the invention, an MOS gated device is resistant to single event radiation and to total dose radiation. A P-type substrate has substantially flat parallel upper and lower surfaces. Laterally spaced N-type body and channel regions extend from the upper surface of the substrate. A respective P-type source region for each of the channel regions extends from the upper surface into their respective channel region at a depth less than the depth of the respective channel regions. A gate oxide layer overlies the channel regions. A gate electrode is disposed atop the gate oxide and is insulated from the spaced channel regions and operates to invert the spaced channel regions in response to the application of a suitable gate voltage to the gate electrode. The gate electrode is comprised of P-type polysilicon. A source electrode is disposed atop the first surface and is connected to each of the source regions.

According to this aspect of the invention, the gate electrode may be silicon dioxide and may have a thickness which is less than 1000 Å. The N-type channel region may be formed by a 100 KeV phosphorus implant at a dose of between $5.5 \times 10^{13}$ atoms/cm$^2$ and $8.0 \times 10^{13}$ atoms/cm$^2$. The gate electrode may have a doping concentration roughly corresponding to a 50 KeV boron implant dose of $5 \times 10^{15}$ atoms/cm$^2$.

According to another aspect of the invention, a power MOSFET having improved total dose radiation resistance and single event further resistance is formed.

According to this aspect of the invention, the gate oxide may be formed by a pyrogenic process. The gate oxide may be annealed after its formation and may have a thickness of about 500 to 1000 Å. The N-type channel region may be formed by a phosphorus implant at a dose of about $7.0 \times 10^{13}$ atoms/cm$^2$.

The radhard P-channel device maintains a threshold voltage of between −2V to −5V at a total irradiation dose of 300 Krad while maintaining SEE withstand capability.

DETAILED DESCRIPTION OF THE DRAWINGS

The Figures show the manner in which a P channel MOS gated device, in particular, a MOSFET can be manufactured in accordance with the invention. The process flow disclosed is similar to that described in U.S. Pat. Nos. 5,338,693 and 5,475,252. However, other process flows can be used.

Figure 1:
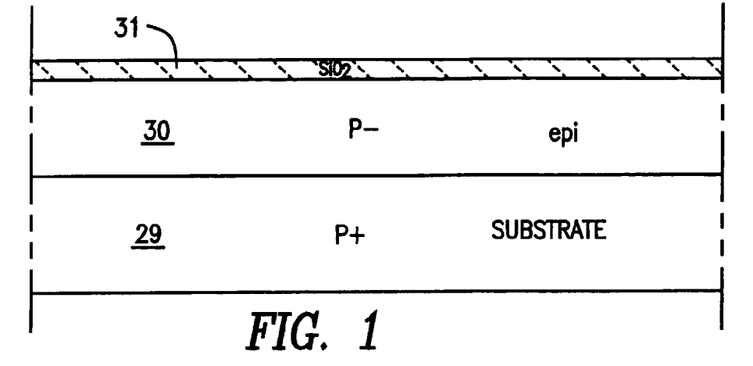
FIG. 1 is a cross-section of a chip of silicon which is to be processed in accordance with the invention and is shown after the growth of a field oxide.

Referring first to FIG. 1, there is shown a portion of a wafer of monocrystalline silicon 29 having an N-type epitaxially deposited layer 30 thereon. In the usual fashion, a large number of identical devices will be fabricated in a common wafer which is later diced to produce individual devices which are appropriately housed. The epitaxial layer 30 may have a resistivity of 4.5-5.5 ohm/cm, for example, for the manufacture of power MOSFET device having a reverse breakdown voltage of 100 to 150 volts. A higher resistivity is used for higher voltage devices.

The first step of the process shown in FIG. 1 is the formation of a field oxide layer 31 having a thickness of about 7500 Å, for example. Any standard oxide growing process may be used.

Figure 2:
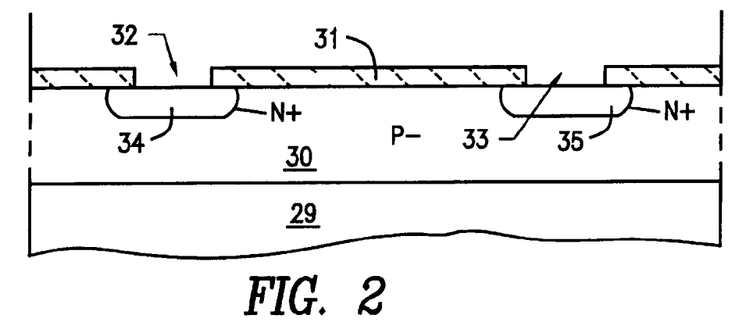
FIG. 2 shows the chip of FIG. 1 after a first mask operation and the ion implantation of a dose of phosphorus.

Then, a first mask is applied to the surface of the oxide layer 31 and an oxide etch is carried out in oxide layer 31 to form openings to the body regions of the cells, shown as openings 32 and 33 in FIG. 2. The oxide etch also forms openings in the oxide layer to the gate bus region as well as to the source and gate bond pad areas (not shown).

After the openings 32 and 33 have been formed, a phosphorus ion implant is carried out in which ions are implanted through the openings 32 and 33 to form shallow N+ regions 34 and 35, respectively. The ion implant step is carried out at an energy of approximately 120 KeV at a dose of about $3.0 \times 10^{15}$ atoms/cm$^2$, for example.

Figure 3:
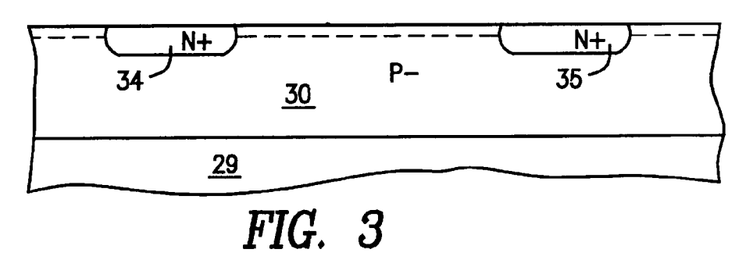
FIG. 3 shows the chip of FIG. 2 after a second mask operation, the etching of the field oxide and the ion implantation of a dose of boron.

Thereafter, a second mask is applied, and a further oxide etch is carried out in which a part of the remaining portion of oxide layer 31 is removed from the active areas of the chip but is left in the termination regions (not shown). A boron ion implant step is then carried out at an energy of roughly 120 KeV and at a dose of about $1 \times 10^{12}$ atoms/cm$^2$, for example. The boron implant reduces the JFET resistance and forms an enhanced P-layer 36, shown in FIG. 3. A screening oxide layer may be grown in the device areas prior to the enhancement implant.

Then, the body and enhancement dopant ions are driven in and, preferably at the same time, a layer 37 of about 4500 Å, for example, of silicon dioxide is grown.

Figure 4:
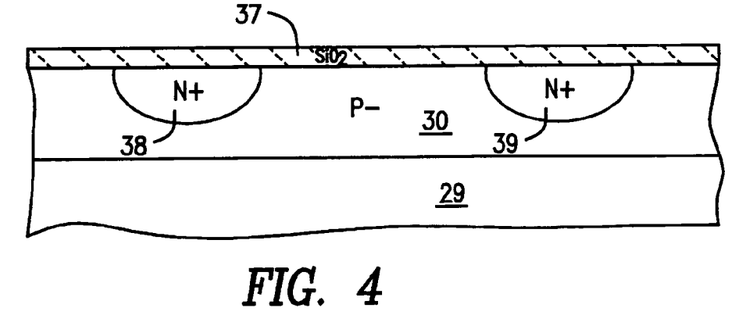
FIG. 4 shows the chip of FIG. 3 after the growth of another oxide layer and the drive in of the phosphorus ions to form N-type regions.

The junction depth of the N+ body regions, and the N+ body diode, grows to form regions 38 and 39 shown in FIG. 4. The depth of the enhancement region 36 also increases but does not form a junction and is therefore not shown herein.

Figure 5:
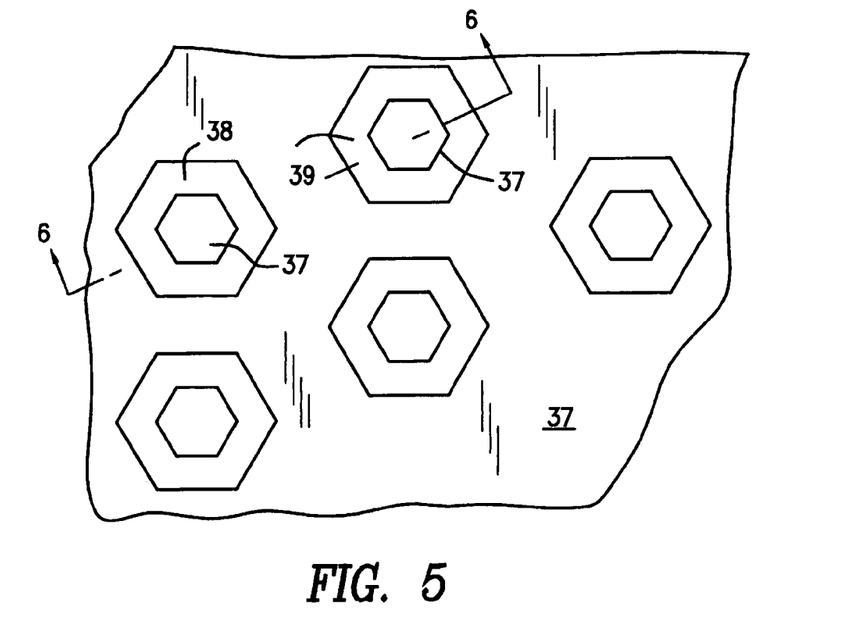
FIG. 5 is a plan view of the chip of FIG. 4 after a third mask operation in which an array of hexagonal openings are etched through the field oxide.
Figure 6:
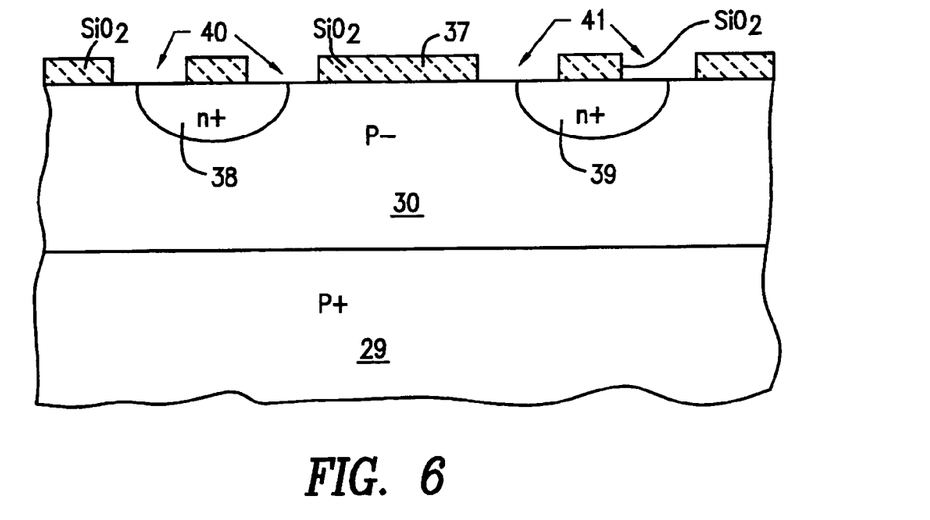
FIG. 6 is a cross-sectional view of FIG. 5 taken across section lines 6-6 in FIG. 5.

A third masking step is then carried out to form the geometry shown in FIGS. 5 and 6. More specifically, hexagonal openings 40 and 41 are etched in the silicon dioxide layer 37. The geometric pattern of a portion of the surface of the device region is shown in FIG. 5, and a cross-section of this pattern is shown in FIG. 6. Though hexagonal openings are shown, other geometric shapes are also possible.

Figure 7:
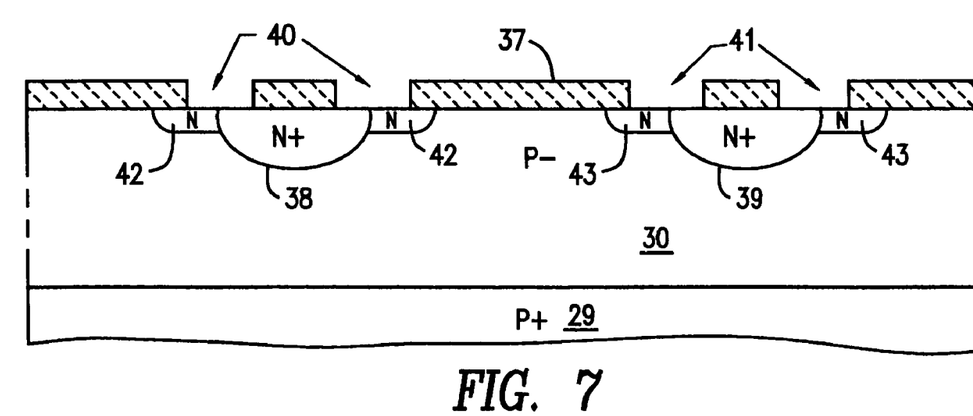
FIG. 7 shows the chip of FIG. 6 in which phosphorus were implanted and driven in through the opened window to form channel regions.

The etched areas 40 and 41 serve as openings for subsequent channel and source implants which are shown in FIG. 7. Typically, a phosphorus ion implant step is carried out at a dose of roughly $5.5 \times 10^{13}$ atoms/cm$^2$ to $8 \times 10^{13}$ atoms/cm$^2$ and at an energy of about 100 KeV, for example. A screening oxide may be grown prior to the implant to protect the surface of the wafer. The phosphorus ions are then driven in to form regions 42 and 43 having a desired junction depth.

Figure 8:
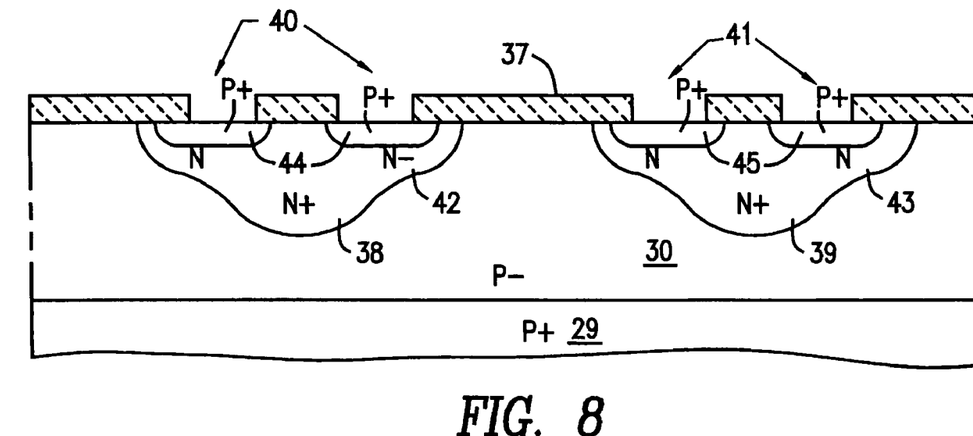
FIG. 8 shows the chip of FIG. 7 after the implantation of boron and an anneal step to form source regions.

Then, boron ions are implanted through openings 40 and 41. The implant is typically carried out at an energy of about 50 KeV at a dose of approximately $3 \times 10^{15}$ atoms/cm$^2$, for example, and is then driven in to form the P+ source regions 44 and 45 shown in FIG. 8.

Figure 9:
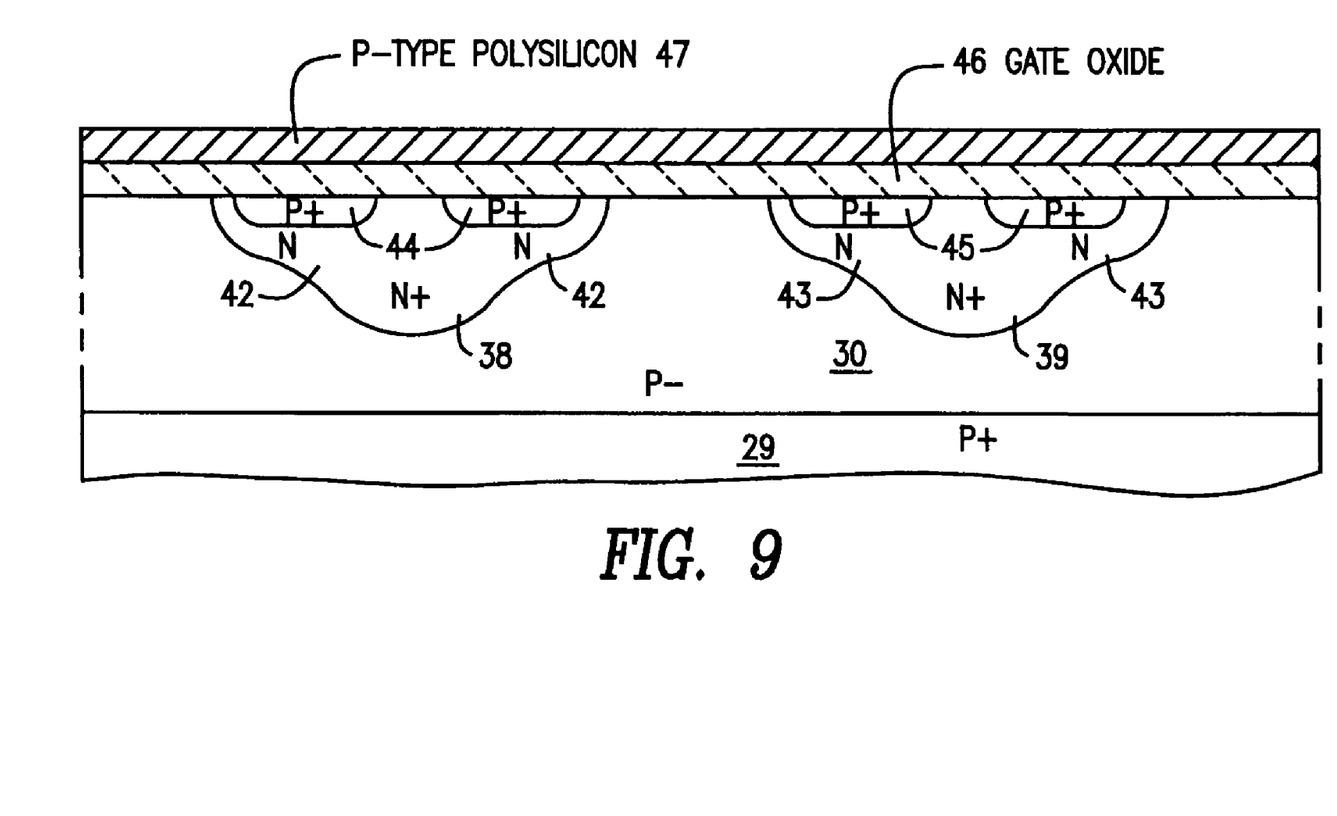
FIG. 9 shows the chip of FIG. 8 after a fourth masking step, the removal of oxide from all cell areas, and the deposition of a thin gate oxide layer and a polysilicon layer.

Thereafter, a fourth mask is formed which exposes the active areas of the wafer, and the oxide atop the active cell areas is removed so that oxide only remains atop the termination region as well as in the pad and gate bus areas (not shown). Then, a gate oxide layer 46 is grown atop the silicon substrate as shown in FIG. 9. A sacrificial oxide (not shown) may be grown in the active areas prior to the formation of the gate oxide and is removed shortly before the gate oxide formation step. The gate oxide layer may also be annealed after its formation.

The gate oxide layer 46 has a thickness of about 500-1000 Å. The gate oxide 46 may be somewhat thicker where it overlies the doped source regions because silicon oxide grows faster over the more heavily doped silicon. The thinnest oxide layer possible was previously grown, since the thinner oxides have a reduced total dose threshold shift in the presence of a radiation dose. However, by growing the gate oxide at the step of FIG. 9 in the manufacturing process, there is a substantial reduction of postoxidation thermal cycling at high temperature which would otherwise make the device more sensitive to radiation.

Following the formation of the gate oxide layer 46, a polysilicon layer 47 is formed over the device surface and, in accordance with another aspect of the invention, is heavily doped with boron. A blanket dose of boron is implanted into the polysilicon to form a layer of P-type polysilicon from which the gate electrode is subsequently formed, according to this aspect of the invention. The polysilicon is doped with about a $5 \times 10^{15}$ atoms/cm$^2$ dose at an energy of roughly 50 KeV, for example. The polysilicon layer 47 is then covered by a very shallow oxide layer (not shown) which can have a thickness, for example, of about 500 Å and can serve as a mask for patterning the polysilicon layer 46 in a later step.

Figure 10:
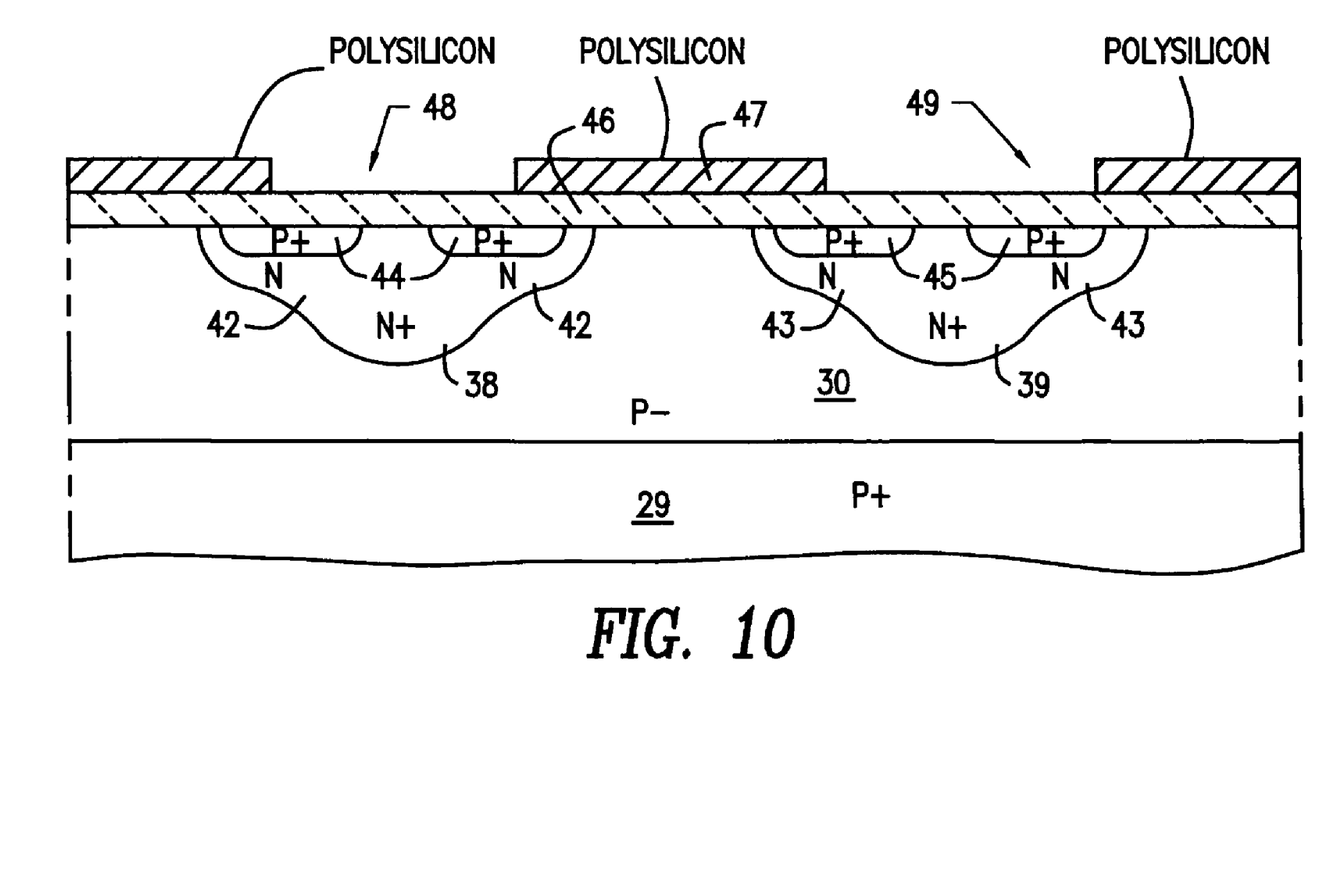
FIG. 10 shows the chip of FIG. 9 after a fifth mask step for patterning the polysilicon.

A fifth masking step then employs a mask to pattern the polysilicon to open hexagonal openings, such as openings 48 and 49 in FIG. 10, at the respective cell sites. The interior edges of the windows 48 and 49 slightly overlap the gate oxide coating over the source regions 46. Consequently, the polysilicon 47 is farther removed from the surface of the silicon 30 to reduce input capacitance.

Figure 11:
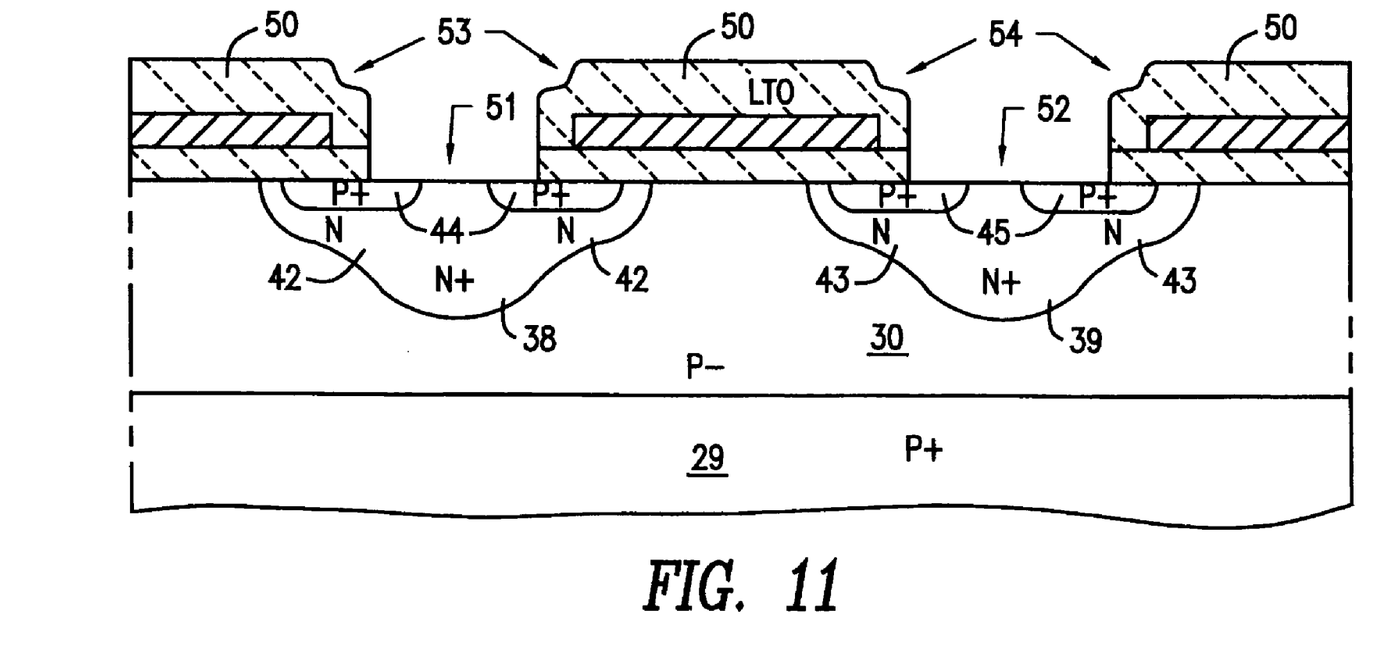
FIG. 11 shows the chip of FIG. 10 after the deposition of an LTO layer and after a sixth mask step in which windows are etched in the LTO layer.

Thereafter, an interlayer oxide 50, such as a 1 micron thick LTO layer is formed over the device surface, as shown in FIG. 11. The oxide layer 50 is then subjected to about 800° C. for about one hour to densify the interlayer oxide material. This reflow step does not adversely affect the properties of gate oxide 46.

The interlayer oxide 50 is then doped with approximately a $1 \times 10^{14}$ atoms/cm$^2$ dose of arsenic ions at an energy of about 120 KeV, for example. The arsenic implant changes the etch rate of the doped portion of the interlayer oxide 50 so that during the subsequent etching steps, the oxide is etched to have tapered profiles 53 and 54 in the contact area. This tapered profile improves the step coverage of the subsequently deposited contact metal layer.

Figure 12:
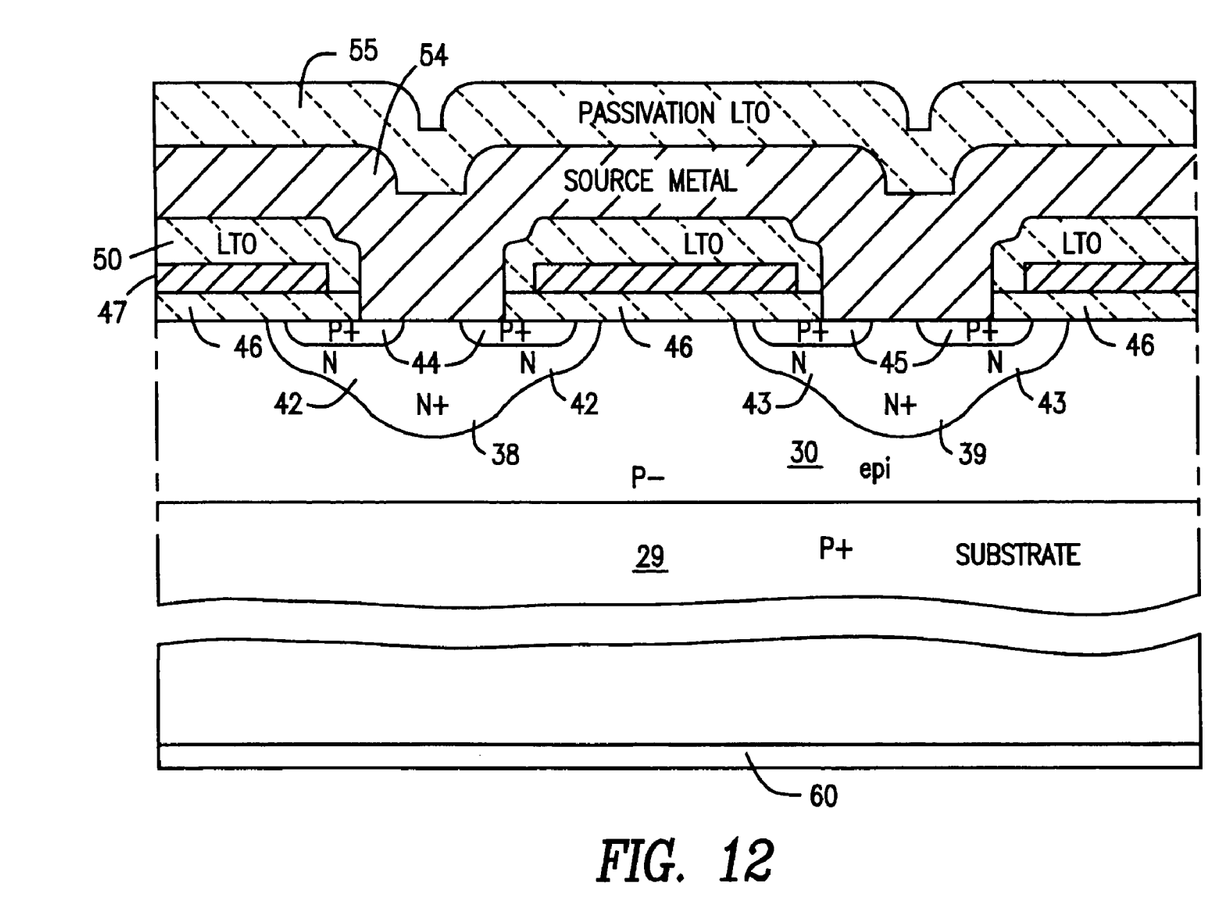
FIG. 12 shows the chip of FIG. 11 after an aluminum contact is deposited over the device surface and after surface passivation and backside metal layers are formed thereon.

Then, a sixth masking operation takes place in which mask openings are located over the center of the body regions 38, 39 to form openings for exposing the silicon for a contact deposition operation. A contact metal layer 54, such as aluminum, shown in FIG. 12, is then deposited over the surface and makes contact with the body regions as well as the source regions 44, 45.

Thereafter, conventional steps are carried out to complete the chip structure, including a seventh masking step and an etching operation which patterns the contact metal coating 54 to define and separate the source electrode from gate bus fingers as disclosed in U.S. Pat. No. 4,593,302, and to remove the contact metal from the termination regions. A scratch coating 55, which may be an LTO surface passivation layer, is then formed.

Then, an eighth masking operation is carried out to define a connection pad etch. A backside metal layer 60 that forms the drain electrode is then deposited.

In the manufacture of the device as described above, it will be apparent that a thin gate oxide 46 is not subjected to substantial thermal cycling, thereby being less sensitive to radiation damage. Indeed, the device exhibits a relatively flat curve of threshold gate-to-source voltage as a function of total radiation up to and exceeding 1 megarad.

In forming the gate oxide 46, the gate oxide can preferably be grown in one of several ways. It can be grown at 900° C. in wet steam without anneal, and can be grown in 975° C. or 1000° C. dry oxygen with no anneal. Both of these methods are known to produce enhanced radiation hardness. Other techniques which can be used are growing the oxide layer 60 at 900° C. in wet steam followed by an anneal at 900° C. in nitrogen. Alternatively, the oxide layer can be grown at 900° C. in wet steam with a dry oxygen gas anneal at 900° C. Both of these processes can enhance radiation hardness. Also the oxide layer can be grown in 975° C. or 1000° C. dry oxygen and annealed in nitrogen or forming gas. These processes can also enhance radiation hardness.

While the contact to the source electrode has been disclosed as an ohmic contact, it is also possible to use a Schottky contact in which the relatively high resistivity source region is directly connected to the aluminum metal. This produces a very inefficient, leaky Schottky contact, which will have an increased resistance and will produce good ballasting for the numerous parallel connected source regions of a given device.

The P-channel device of the invention is optimized to provide both SEE withstand capability as well as total irradiation dose protection. In the known radhard devices, such optimization requires significant trade offs between the total irradiation dose protection requirements, which call for thinner gate oxides and low channel doping, and protection against single event burnout, which favors thicker gate oxides and higher channel doping. By contrast and as shown below, the P-channel device of the present invention includes optimal oxide thicknesses for both total radiation dose resistance and SEE resistance.

To show the total radiation dose resistance and SEE resistance of the P-channel device, the following tests were performed:

Sample wafers were taken from three respective production lots that include −60V, −100V and −200V rated P-channel power devices that were manufactured according to the invention. In this example, the size of the devices were either 6.53×6.53 mm or size 6.53×9.14 mm. For total radiation dose testing, eight die were selected from each wafer, with four being tested under Vgs bias and four tested under Vds bias. For SEE testing, sample wafers were randomly selected from the wafers that passed total irradiation dose testing.

The sample devices were each mounted in a hermetic T0-3 package in which the die were attached using a soft solder. However, for SEE testing, the cap of the T0-3 package was removed to permit the beam to directly strike the die.

To determine their total radiation dose resistance, the devices were irradiated with gamma radiation using a cobalt-60 source in accordance with military specification MIL-STD-750, method 1019, condition A. The sample devices were each attached to a circuit board, and then either Vgs or Vds biased and exposed to the Co-60 source. The samples were irradiated at a dose rate between 50 to 2000 rads(si)/s with the cumulative total dose determined by the exposure time.

Figure 13A:
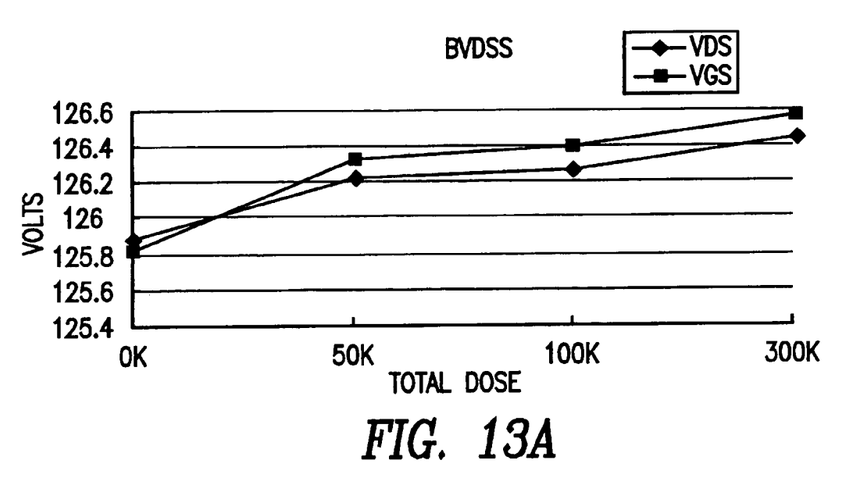
FIGS. 13A-13C show the typical device response of the device of the present invention as a function of total dose irradiation.
Figure 13B:
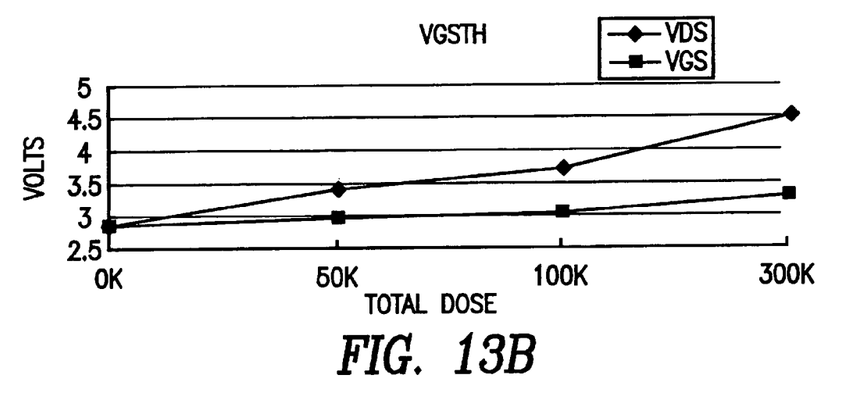
Figure 13C:
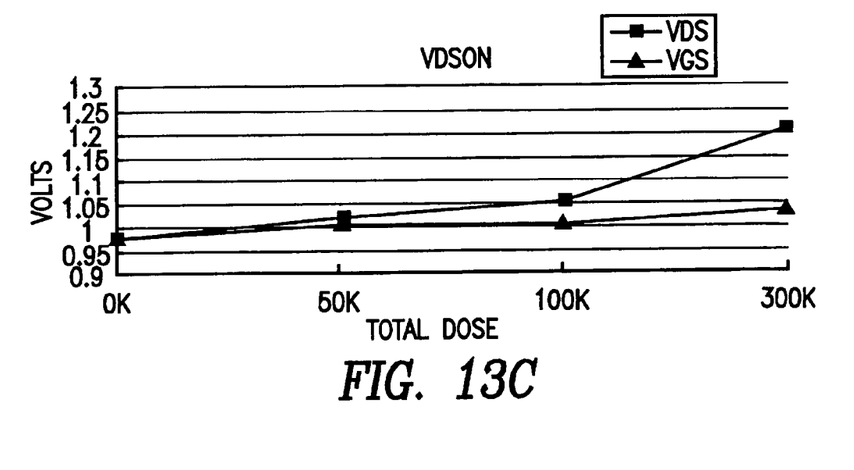

Following irradiation, the samples were removed from the radiation source and tested within one hour of removal for the BVDSS behavior, VGSTH behavior and VDSON behavior as a function of total radiation doses as shown in FIGS. 13A-13C, respectively. As shown, the devices were either tested under Vgs bias, in which the devices were shorted from drain to source and a potential of −12V applied from gate to source, or under Vds bias in which the samples were shorted from gate to source at a potential of 80% of the rated BVDSS applied from the drain to the source. As FIG. 13B shows, the threshold voltage changes by less than 1V over the range of doses from 0 to 300 Krad and remains well within the specified −5V limit even after receiving a dose of 300 Krad(Si).

The wafers were then tested for SEE resistance using the 88 inch diameter cyclotron at Lawrence Berkeley Laboratories to test for compliance with the Test Procedures for the Measurement of Single-Event Effects in Semiconductor Devices from Heavy Ion Irradiation EIA/JESD 57. The sample sizes used were those recommended by the Defense Supply Center in Columbus, Ohio using a recent publication of requirements for MOSFET device.

Figure 14:
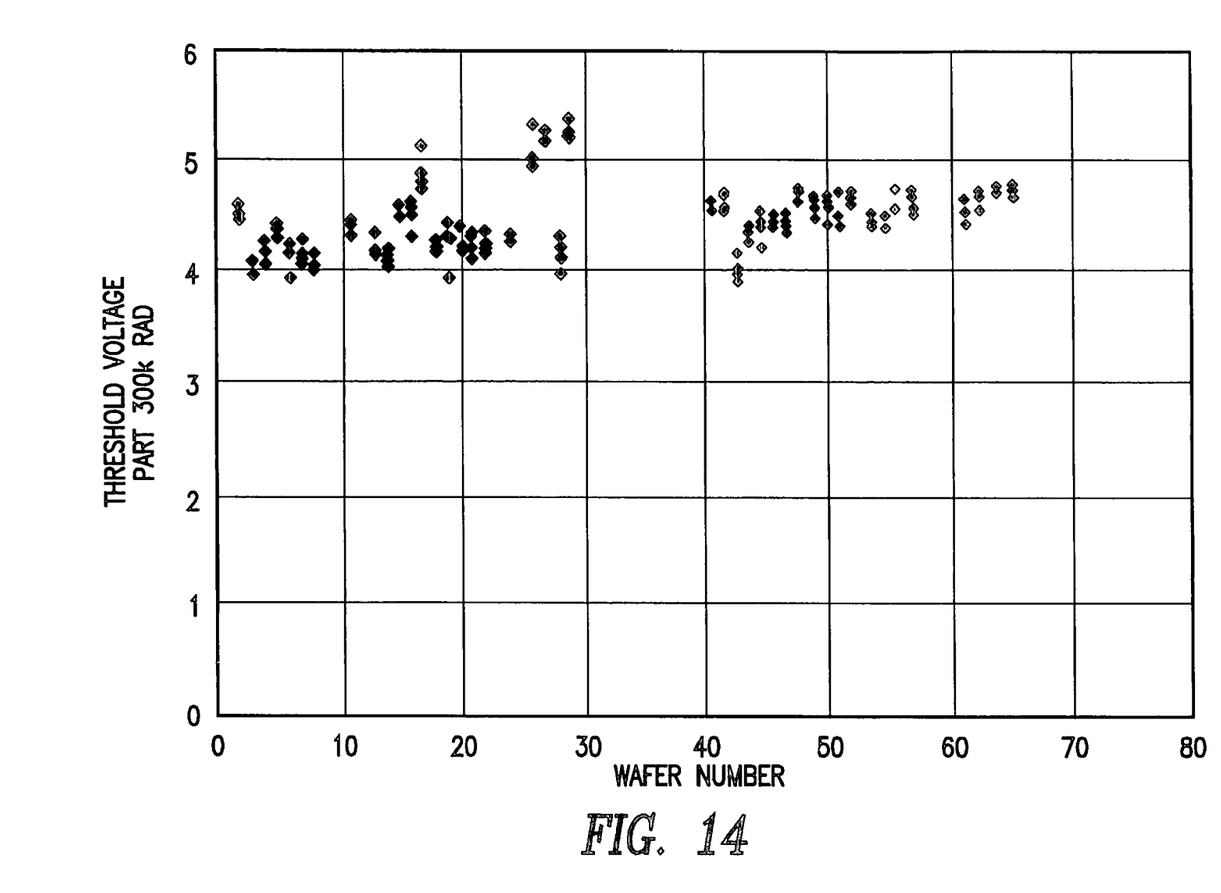
FIG. 14 is a diagram showing the threshold voltage of an example of the invention after receiving a 300 Krad irradiation dose.

Here, the caps of the TO-3 packages were removed, and the devices placed into a vacuum chamber. An ion beam was directed onto the die and covered the complete die surface. The samples were irradiated, one at a time, for a period determined by the ion flux and the desired fluence of the ion beam. In this example, the ion flux was limited to $1 \times 10^4$ ions/cm$^2$/s and the fluence was set at $5 \times 10^5$ ions. In this example, the samples were irradiated with krypton ions with an LET of 41 MeV/(mg/cm$^2$) at an energy of four hundred MeV. Devices of each high power type were tested at each combination of Vgs and Vds bias. The measured threshold voltages of each device are shown in FIG. 14. As shown, the threshold voltage remains with the −5V specification. Thus, the P-channel device of the invention is suitable for both total radiation dose environments as well as SEE environments, particularly for the more common applications where the P-channel device receives a positive gate voltage of no more than a few volts.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A P-channel MOS gated device which is resistant to single event radiation failure and having improved total dose radiation resistance; said device comprising:
    a P-type substrate having parallel upper and lower surfaces;
    a plurality of laterally spaced N-type body regions extending from said upper surface into said substrate;
    at least one respective P-type source region formed in each of said body regions in said upper surface of said substrate and defining a respective channel region in said upper surface in said N-type body region;
    a gate electrode comprised of polysilicon implanted with p-type dopants disposed atop and insulated from said channel region and operable to invert said channel region in response to application of a suitable gate voltage to said gate electrode said gate electrode being insulated from said channel region by a gate oxide layer comprising silicon dioxide, said gate oxide layer being comprised of radiation hardened silicon dioxide and less than 1000 Å thick;
    an interlayer oxide disposed over each gate electrode and having tapered profile portions each aligned with a respective P-type source region; and
    a source electrode disposed atop said upper surface and connected to said at least one P-type source region;
    wherein said gate oxide is capable of withstanding damage due to total radiation dose and capable of withstanding damage due to a single event effect that may cause a threshold voltage shift to −5 volts.

2. The MOS gated device of claim 1 wherein said gate oxide layer has a thickness of between 500 to 1000 Å.

3. The MOS gated device of claim 1 wherein each of said N-type body regions has a doping concentration corresponding to that of approximately 100 KeV phosphorus implant at a dose of about $5.5 \times 10^{13}$ atoms/cm$^2$.

4. The MOS gated device of claim 1 wherein each of said N-type body regions has a doping concentration corresponding to that of approximately 100 KeV phosphorus implant at a dose of about $8.0 \times 10^{13}$ atoms/cm$^2$.

5. The MOS gated device of claim 1 wherein said substrate includes a chip of monocrystalline silicon at said lower surface of said substrate and an epitaxial layer formed atop said chip that is less heavily doped than said chip.

6. The MOS gated device of claim 1 wherein at least one of said N-type body regions includes a portion adjacent to said upper surface that is more heavily doped than another portion of said N-type body region that is adjacent to a lower boundary between said N-type body region and said substrate.

7. The MOS gated device of claim 1 wherein said interlayer oxide is a low temperature oxide.

8. The MOS gated device of claim 1 further comprising a passivation layer formed atop said source electrode.

9. The MOS gated device of claim 8 wherein said passivation layer is comprised of low a temperature oxide.

10. The MOS gated device of claim 1 wherein said gate electrode has a doping concentration corresponding to that of approximately 50 KeV boron implant of about $5 \times 10^{15}$ atoms/cm$^2$.

* * * * *